US011021270B2

United States Patent
Honour et al.

(10) Patent No.: US 11,021,270 B2
(45) Date of Patent: Jun. 1, 2021

(54) THERMAL MANAGEMENT SYSTEM FOR STRUCTURES IN SPACE

(71) Applicant: AST & Science, LLC, Miami, FL (US)

(72) Inventors: Ryan D. Honour, Midland, TX (US); Javier Hernandez Bahlsen, Esplugues de Llobregat (ES); Huiwen Yao, Potomac, MD (US); Adam H. Halperin, Silver Spring, MD (US); Abel Avellan, Coral Gables, FL (US)

(73) Assignee: AST & Science, LLC, Miami, FL (US)

( * ) Notice: Subject to any disclaimer, the term of this patent is extended or adjusted under 35 U.S.C. 154(b) by 0 days.

(21) Appl. No.: 16/875,738

(22) Filed: May 15, 2020

(65) Prior Publication Data

US 2020/0365966 A1 Nov. 19, 2020

Related U.S. Application Data

(60) Provisional application No. 62/978,081, filed on Feb. 18, 2020, provisional application No. 62/977,864, (Continued)

(51) Int. Cl.
| | |
|---|---|
| *H01Q 1/02* | (2006.01) |
| *B64G 1/22* | (2006.01) |
| *B64G 1/44* | (2006.01) |
| *H01Q 1/28* | (2006.01) |
| *B64G 1/10* | (2006.01) |
| *H02S 10/40* | (2014.01) |
| *H02S 40/42* | (2014.01) |

(52) U.S. Cl.
CPC ............ *B64G 1/222* (2013.01); *B64G 1/1007* (2013.01); *B64G 1/443* (2013.01); *H01Q 1/02* (2013.01); *H01Q 1/288* (2013.01); *H02S 10/40* (2014.12); *H02S 40/425* (2014.12)

(58) Field of Classification Search
CPC ................................. H01Q 1/02; H01Q 1/288
See application file for complete search history.

(56) References Cited

U.S. PATENT DOCUMENTS

| 4,843,397 A | 6/1989 | Galati et al. |
| 5,196,857 A | 3/1993 | Chiappetta et al. |

(Continued)

FOREIGN PATENT DOCUMENTS

| CN | 103731935 A | 4/2014 |
| EP | 3109659 A1 | 12/2016 |
| GB | 2536017 A | 9/2016 |

OTHER PUBLICATIONS

International Search Report for PCT/US20/33225, dated Aug. 12, 2020, 13 pages.

(Continued)

*Primary Examiner* — Graham P Smith
(74) *Attorney, Agent, or Firm* — Blank Rome LLP (57) ABSTRACT

An antenna assembly has a solar layer having one or more solar cells generating solar power, an antenna layer connected to the solar layer and having electronic components utilizing the solar power generated by the solar layer, and a thermal dissipation device dissipating heat locally at the antenna assembly. A large number of antenna assemblies are connected to form an antenna array in which heat is generated locally at each antenna assembly and dissipated locally at each antenna assembly.

22 Claims, 3 Drawing Sheets

Related U.S. Application Data filed on Feb. 18, 2020, provisional application No. 62/977,860, filed on Feb. 18, 2020, provisional application No. 62/848,317, filed on May 15, 2019.

(56) References Cited

U.S. PATENT DOCUMENTS

| | | |
|---|---|---|
| 5,465,096 A | 11/1995 | Nawata |
| 5,666,127 A | 9/1997 | Kochiyama |
| 5,810,297 A | 9/1998 | Basuthakur |
| 5,909,299 A | 6/1999 | Sheldon, Jr. et al. |
| 5,925,092 A | 7/1999 | Swan et al. |
| 6,087,991 A | 7/2000 | Kustas |
| 6,157,642 A | 12/2000 | Sturza et al. |
| 6,314,269 B1 | 11/2001 | Hart |
| 6,590,150 B1 | 7/2003 | Kiefer |
| 6,923,249 B1 | 8/2005 | Porter et al. |
| 6,975,582 B1 | 12/2005 | Karabinis |
| 6,990,314 B1 | 1/2006 | Hagen |
| 7,357,356 B1 | 4/2008 | Goodzeit |
| 8,736,108 B1 | 5/2014 | Nielson et al. |
| 8,757,554 B1 | 6/2014 | Harvey et al. |
| 9,150,313 B2 | 10/2015 | Puig-Suari et al. |
| 9,248,924 B2 | 2/2016 | Puig-Suari et al. |
| 9,473,234 B2 | 10/2016 | Shreve et al. |
| 9,570,795 B1 | 2/2017 | Bruce et al. |
| 9,664,726 B2 | 5/2017 | Platzer et al. |
| 9,673,889 B2 | 6/2017 | Platzer et al. |
| 9,815,573 B2 | 11/2017 | Woods |
| 9,973,266 B1 | 5/2018 | Avellan et al. |
| 2001/0034206 A1 | 10/2001 | Thompson |
| 2002/0102939 A1 | 8/2002 | Shaneyfelt |
| 2005/0248491 A1 | 11/2005 | Leyre et al. |
| 2007/0155318 A1 | 7/2007 | Monte |
| 2007/0184778 A1 | 8/2007 | Mechaley |
| 2007/0250267 A1 | 10/2007 | Jaeger |
| 2008/0055177 A1 | 3/2008 | Dixon |
| 2008/0087769 A1 | 4/2008 | Johnson |
| 2008/0122690 A1 | 5/2008 | Wan |
| 2010/0046853 A1 | 2/2010 | Goodnough |
| 2011/0023484 A1 | 2/2011 | Lu et al. |
| 2011/0063189 A1 | 3/2011 | Cohen et al. |
| 2012/0217348 A1 | 8/2012 | Aguirre Martinez |
| 2012/0287018 A1 | 11/2012 | Parsche |
| 2012/0325974 A1 | 12/2012 | Baudasse et al. |
| 2013/0009851 A1 | 1/2013 | Danesh |
| 2013/0113996 A1 | 5/2013 | Zhu |
| 2013/0148696 A1 | 6/2013 | Ryu |
| 2014/0266872 A1 | 9/2014 | Mitola, III |
| 2015/0162656 A1 | 6/2015 | Fitz-Coy et al. |
| 2015/0180114 A1 | 6/2015 | Achour |
| 2015/0217876 A1 | 8/2015 | Halsband |
| 2015/0249462 A1 | 9/2015 | Chang |
| 2015/0371431 A1 | 12/2015 | Korb |
| 2016/0011318 A1* | 1/2016 | Cohen ............ G01S 19/425 342/357.26 |
| 2016/0056321 A1 | 2/2016 | Atwater et al. |
| 2016/0065006 A1 | 3/2016 | Woods |
| 2016/0251092 A1 | 9/2016 | Cappaert et al. |
| 2016/0253284 A1 | 9/2016 | Cappaert et al. |
| 2017/0043885 A1 | 2/2017 | Marchandise |
| 2017/0070939 A1 | 3/2017 | Chong et al. |
| 2017/0099095 A1 | 4/2017 | Wang |
| 2017/0214144 A1 | 7/2017 | Cohen et al. |
| 2017/0250751 A1 | 8/2017 | Kargieman |
| 2017/0254905 A1 | 9/2017 | Reis |
| 2017/0285178 A1 | 10/2017 | Platzer |
| 2017/0300654 A1 | 10/2017 | Stein |
| 2019/0238216 A1 | 8/2019 | Avellan et al. |

OTHER PUBLICATIONS

International Search Report for PCT/US20/33231, dated Aug. 11, 2020, 16 pages.
International Search Report for PCT/US20/33225, dated Aug. 12, 2020, 3 pages.
International Search Report for PCT/US20/33231, dated Aug. 11, 2020, 3 pages.
Examination Report for EP Application No. 17192639.7, dated Sep. 28, 2018, 5 pages.
International Search Report and Written Opinion for PCT/US18/36929, dated Aug. 31, 2018, 10 pages.
Rainey K., "CubeSats: Shaping Possibilities in Space," Feb. 22, 2017, https://www.nasa.gov/mission_pages/station/research/news/cubesats_possibilities, 3 pages.
Williams, K., "NASA Small Sastellites to Demonstrate Swarm Communications and Autonomy," Dec. 7, 2015, https://www.nasa.gov/feature/nasa-small-satellites-to-demonstrate-swarm-communications-and-autonomy, 2 pages.
Gaudin S., "Swarms of smart nano-satellites may offer global connectivity (with video)," Sep 15, 2015, Computerworld, https://www.computerworld.com/article/2983637/emerging-technology-swarms-of-smart-nano-satellites-may-offer-global-connectivity-with-video-html, 6 pages.
"ISRO sets new world record, successfully puts 104 satellites into Earth's orbit," India TV News Desk, Feb. 15, 2017, http://www.indiatvnews.com/news/india-countdown-begins-india-to-launch-record-104-satellites-on-single-rocket-368925, 8 pages.
Konechy G., "Small Satellites—A tool for Earth observation?" Jan. 2004, https://www.researchgate.net/publication/229028414_Small_satellites-A_tool_for_Earth_observation?, 4 pages.
Nodes—Spacecraft network operations demonstration using multiple spacecraft in an autonomously configured space network allowing crosslink communications and multipoint scientific measurements, National Aeronautics and Space Administration, www.nasa.gov, Aug. 1, 2016, 2 pages.

* cited by examiner

THERMAL MANAGEMENT SYSTEM FOR STRUCTURES IN SPACE

RELATED APPLICATIONS

This application claims the benefit of priority of U.S. Application No. 62/848,317, filed on May 15, 2019, Spanish Application No. 202030123, filed on Feb. 13, 2020, and U.S. Application No. 62/977,864 filed on Feb. 18, 2020. This application also claims priority to Spanish Application No. 202030124, filed on Feb. 13, 2020, Spanish Application No. 202030125, filed on Feb. 13, 2020, U.S. Application No. 62/977,860, filed Feb. 18, 2020, and U.S. Application No. 62/978,081, filed Feb. 18, 2020. The content of those applications is relied upon and incorporated herein by reference in their entireties. The present application further incorporates by reference the content of U.S. application Ser. No. 16/875,646, titled Low Earth Orbit Mechanical Deployable Structure, filed May 15, 2020, and U.S. application Ser. No. 16/875,703, titled Solar, Electronic, RF Radiator for a Self-Contained Structure for Space Application Array, filed May 15, 2020.

BACKGROUND

Figure 1A:
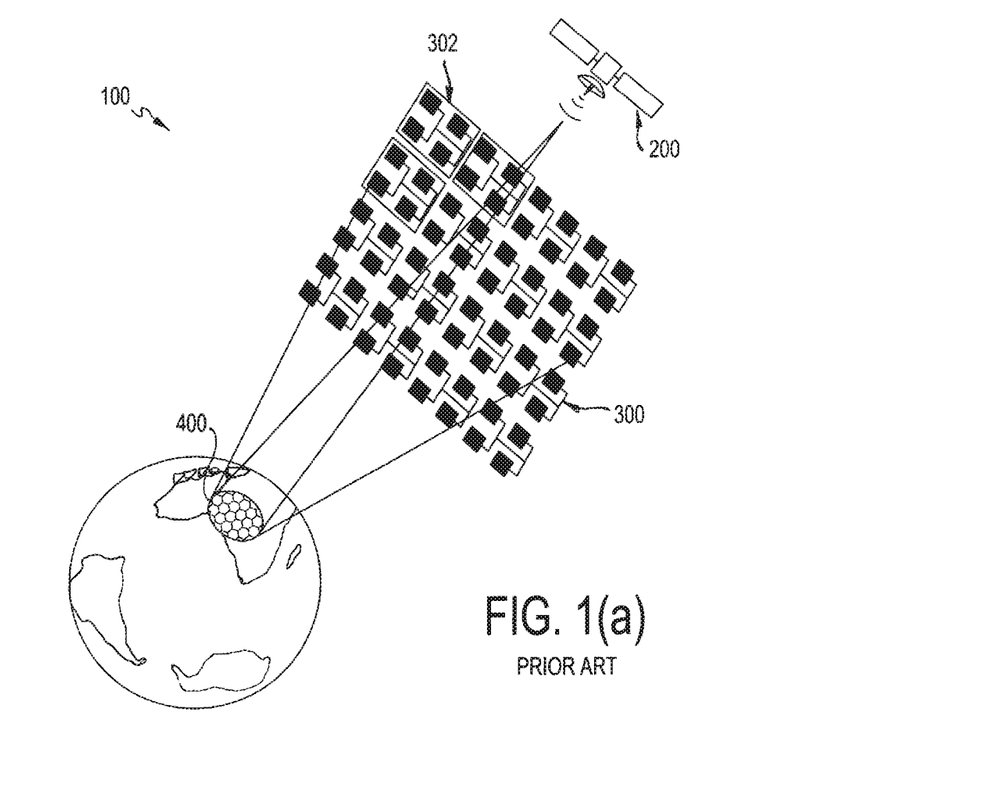
FIGS. 1(a), 1(b) show a conventional structural array.
Figure 1B:
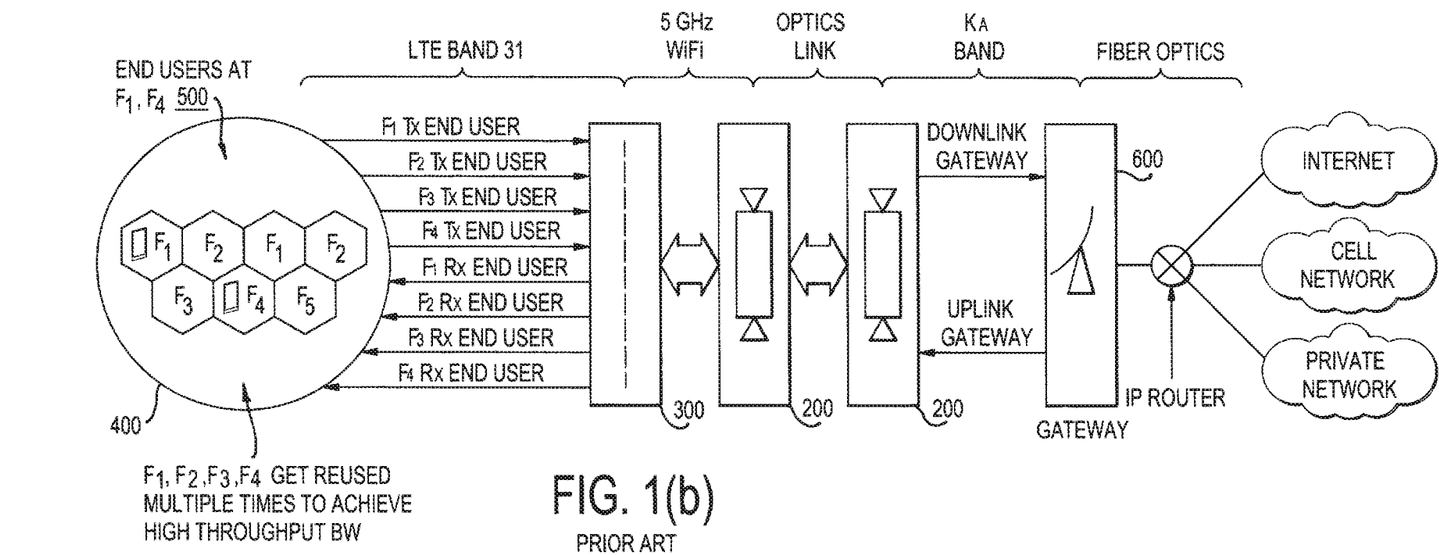

U.S. Pat. No. 9,973,266 and U.S. Publ. No. 2019/0238216 show a system for assembling a large number of small satellite antenna assemblies in space to form a large array. The entire content of the '266 patent is incorporated herein by reference. As disclosed in the '266 Patent, FIGS. 1(a), 1(b) show a satellite communication system 100 having an array 300 of small satellites 302 and a central or control satellite 200. The small satellites 302 communicate with end users 500 within a footprint 400 on Earth, and also communicate with the control satellite 200, which in turn communicates with a gateway 600 at a base station. The small satellites 302 can each include, for example, a processing device (e.g., a processor or controller) and one or more antenna elements. And the control satellite 200 can include a processing device and one or more antenna or antenna elements.

SUMMARY

An antenna assembly is provided that balances temperatures during deployment and during operation, including during sunlight and shadow to avoid excessive temperatures and wide temperatures swings that might otherwise damage the antenna assembly. Temperature is dispersed during sunlight to prevent the antenna assembly from excessive heat. Temperature is maintained during shadow when temperatures are low in space.

DETAILED DESCRIPTION

In describing the illustrative, non-limiting embodiments of the disclosure illustrated in the drawings, specific terminology will be resorted to for the sake of clarity. However, the disclosure is not intended to be limited to the specific terms so selected, and it is to be understood that each specific term includes all technical equivalents that operate in similar manner to accomplish a similar purpose. Several embodiments of the disclosure are described for illustrative purposes, it being understood that the disclosure may be embodied in other forms not specifically shown in the drawings.

Turning to the drawings, FIGS. 2-5 show a structural assembly, here an antenna assembly 310, in accordance with one example embodiment of the disclosure. The antenna assembly 310 can be utilized in any satellite system, such as the satellite communication system 100 of FIGS. 1(a), 1(b). The antenna assembly 310 can also be utilized separately by itself or for other purposes than for an antenna or communications.

In one embodiment, the antenna assembly 310 is configured to be utilized in combination with a plurality of antenna assemblies to form a large antenna array in space. The individual antenna assemblies 310 are structurally and/or electrically coupled together in great numbers to form a large structure in space, such as the array 300 of FIGS. 1(a), 1(b). The array has a stowed or storage configuration, and a deployed or operating configuration. The plurality of antenna assemblies are transported into space in a stowed configuration. In the stowed configuration, the antenna assemblies 310 are in a compact arrangement, such as being folded upon each other in a stacked manner. Once in space, the antenna assemblies are moved into the deployed configuration, where they are unfolded with respect to one another and expand outward to be substantially planar with one another. Each satellite array has a plurality of satellite module assemblies 310 that are mechanically connected together by one or more connectors 372. The plurality of satellite module assemblies can be connected in space to form the single large phase array having a single orbital inclination and/or single aperture.

The antenna assembly 310 has a first outer layer 320, a middle layer 350, and a second outer layer 380. The first outer layer 320 is an aluminum reflector that retains the antenna elements, and is sometimes referred to here as the RF (radio frequency) layer or antenna layer. The middle layer 350 is a support structure such as a lightweight, rigid honeycomb. The second outer layer 380 is a solar panel having one or more solar cells that collect solar energy from the sun, and is sometimes referred to here as the solar layer. The antenna assembly 310 is configured for the RF layer 320 to be closest to the Earth so that the antenna elements are nadir facing (face the Earth) to best communicate with user devices on the ground without any interference or obstruction (i.e., no physical interference by the antenna assembly, and no (or reduced) electrical interference from other electronic devices at the antenna assembly). In addition, the solar layer 380 is zenith facing (faces away from the Earth) and collects solar energy from the sun and generates power from the solar energy that can be utilized to power electronic components on the antenna assembly 310.

Figure 2:
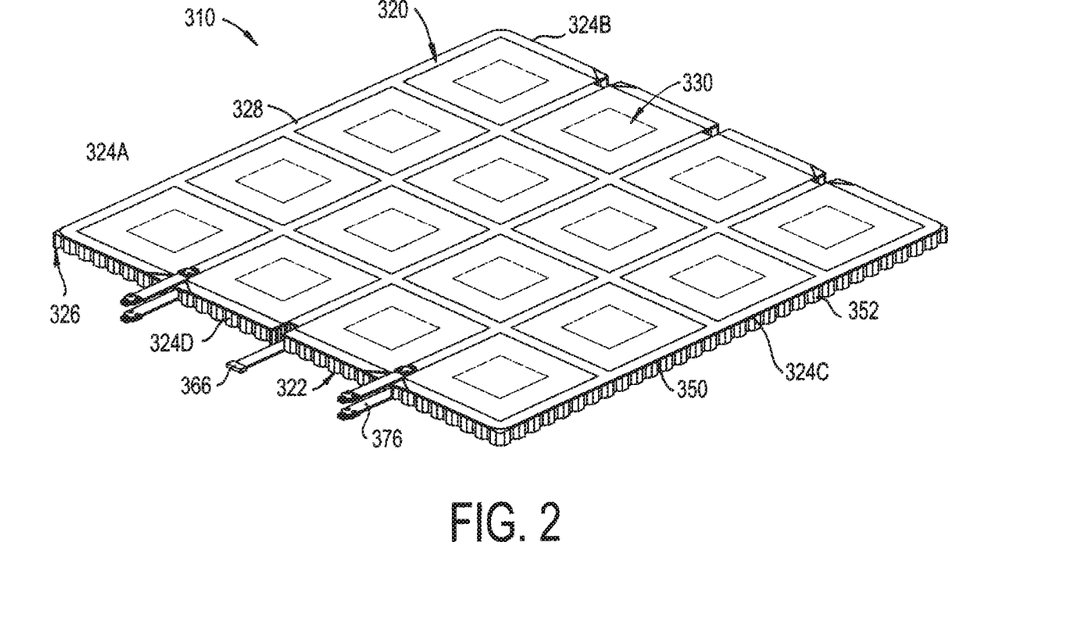
FIG. 2 is a perspective view of the RF side of the antenna assembly without the antenna elements.
Figure 3:
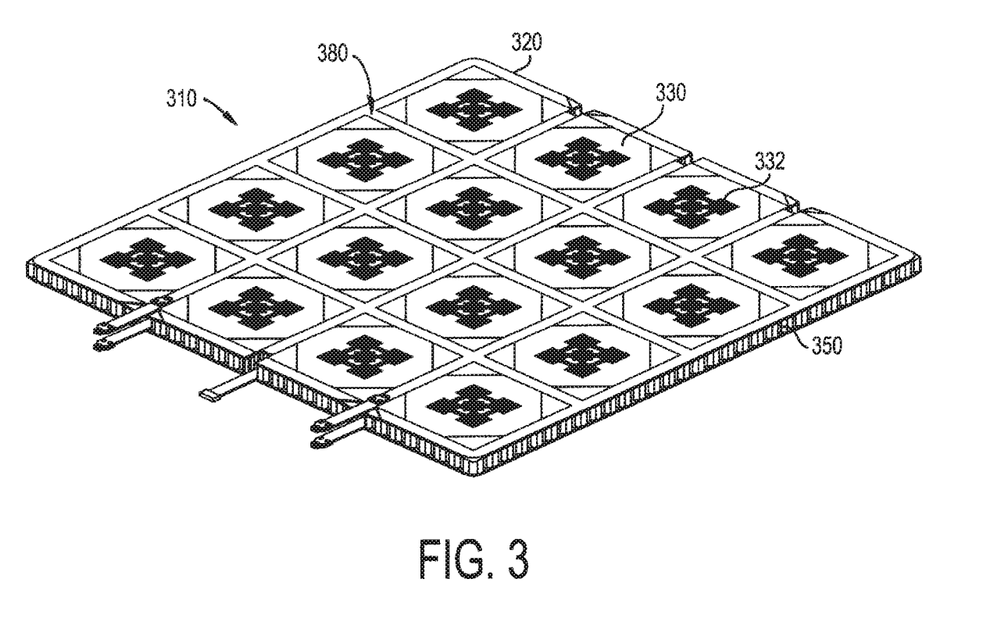
FIG. 3 is a perspective view of the RF side of the antenna assembly with the antenna elements.
Figure 4:
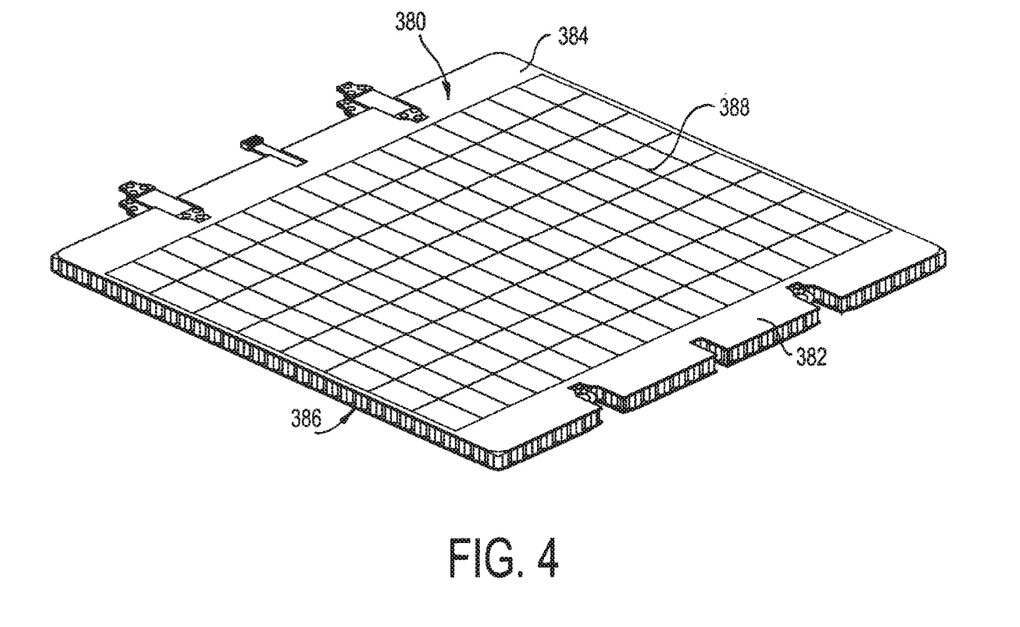
FIG. 4 is a perspective view of the solar side of the antenna assembly.
Figure 5:
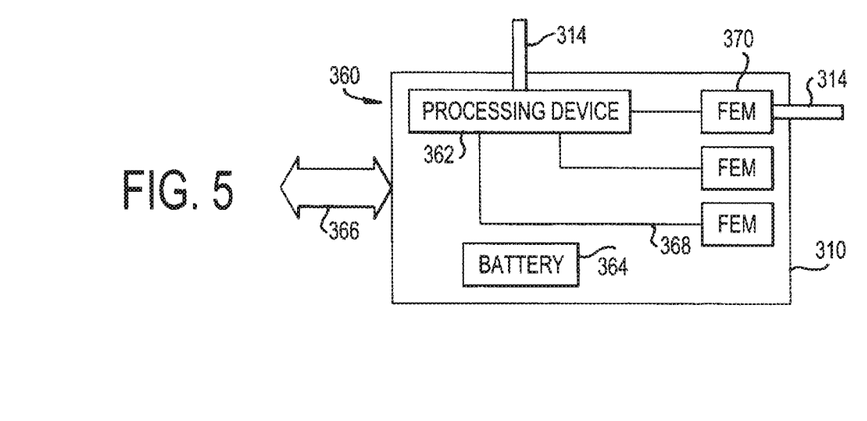
FIG. 5 is a block diagram of the antenna assembly.

Each antenna assembly 310 has a circuit or component assembly 360 (FIG. 5) and a structural assembly (FIGS. 2-4). The component assembly 360 includes an antenna 332, and an electronic circuit. The electronic circuit can include a variety of one or more electronic components including, for example, a processing device such as processor 362, cables 366, FEM 370, and/or a power supply, such as a battery or batteries 364. The structural assembly houses and supports the component assembly 360 and can include, for example, the outer layers 320, 380, the middle layer 350, and accompanying structural elements. Though certain elements are described as being part of the circuit assembly and other elements as part of the structural assembly, the elements can be considered part of the other assembly or both the circuit assembly and the structural assembly.

RF Layer 320

The RF layer 320 is best shown in FIGS. 2, 3. The RF layer 320 has a body 322 and receives a plurality of antenna 332 used to communicate with another satellite, a base station, or user devices on Earth. The body 322 has a rectangular or square shape with four sides 324a, 324b, 324c, 324d, an outward-facing surface 328 and an inward-facing surface 326. The body 322 is formed as a thin flat conductive plate and is lightweight. In one example, the body is made of aluminum to form an antenna ground. One or more antennas 332 are mounted to the body 322. The body 322 provides sufficient structure and support for the antennas 332 to be mounted to the body 322, yet is lightweight. The RF layer 320 also operates as a thermal reflector to disperse heat throughout the antenna assembly 310.

One or more recesses or pockets 330 are provided in the body 322 of the RF layer 320. In the example embodiment shown in the figures, there are a plurality of pockets 330 aligned in rows and columns, here shown as a 4×4 array. The pockets 330 extend inward from the outward facing surface 328 toward the inward facing surface 326. Accordingly, the pockets 330 form a recess on the outward-facing surface 328 of the body 322, and project slightly outward from the inward-facing surface 326 of the body. The pockets 330 can have an octagon shape with eight sides, as shown in FIG. 3, or can have any suitable shape such as square (as shown in FIG. 2), rectangular, or circular.

An antenna 332 is received and mounted in each of the pockets 330 to form an array of antennas 332, here a 4×4 array of 16 antennas 332. The antenna 332 can have a substrate, such as a printed circuit board, and one or more antenna elements mounted on the substrate. The antenna elements communicate signals, for example RF signals, to and from the antenna assembly 310. In the example of FIG. 3, each antenna 332 has four antenna elements interconnected with one another, though more or fewer can be provided depending on the application. The antennas 332 fill the pocket 330 recess and are aligned to be flush with the outward-facing surface 328 of the RF layer 320. Accordingly, the antenna elements face outward from the outward-facing surface 328 of the RF layer 320, which is also the outer-facing surface of the entire antenna assembly 310.

The outward-facing surface 328 is substantially planar, so that the antenna elements are also planar with one another. The plurality of antenna elements from the plurality of antennas 332 all face the Earth without obstruction or interference. When the antenna assembly 310 is connected in an array of a plurality of antenna assemblies, the antenna elements combine with each other and with the antenna elements in the entire antenna assembly array, which is substantially planar, to form a large antenna structure in space. In accordance with one embodiment of the present disclosure, in the deployed configuration the antenna assemblies 310 form a contiguous uniform uninterrupted surface so that the sides 324 come into contact with one another to form a single contiguous uniform and planar surface without gaps between adjacent antenna assemblies 310. The first layer 310 also serves as a reflector to provide a ground for the antennas, and as a radiator.

Solar Layer 380

Referring to FIG. 4, the solar layer 380 has a body 382 with a rectangular or square shape with four sides, an outward-facing surface 384 and an inward-facing surface 386. The body is formed as a thin flat conductive plate and is lightweight. In one example, the body is made of aluminum to form an antenna ground. One or more solar cells 388 are mounted to the outward-facing surface 384 of the solar layer 380, i.e., at the side of the antenna assembly 310 that faces away from the Earth. The body 382 provides sufficient structure and support for the one or more solar cells to be mounted to the body 382, and is lightweight.

The solar cells 388 collect solar energy to generate solar power that is the primary power source to power the circuit assembly of the antenna assembly 310. The battery 364 forms a secondary or backup power supply in the event the solar cells do not generate sufficient power, and can be rechargeable batteries that are charged by the solar cells 120 when the solar cells 120 generate excess power.

Each solar layer 380 generates solar power locally at the antenna assembly 310. When the antenna assemblies 310 are utilized in an array of antenna assemblies 310, the power scales up to generate large amounts of power, e.g., over 100 kW of DC power and up to hundreds of kilowatts of DC power. The array is modular and scalable by adding more antenna assemblies 310. The more antenna assemblies 310 that are provided in the array, the greater the power. In addition, the antenna assemblies 310 not only generate power (via the solar layer 380) locally at each antenna assembly 310, but the power is used locally at that same antenna assembly 310 where the power is generated. For example, the power is used by electronic components, such as the processing device 362, antenna 332, and Front End Modules (FEMs) 370.

The solar cell 388 can be positioned on the surface that faces away from the Earth; here, the outer-facing surface 384 of the solar layer 380. The solar cell receives solar energy from the Sun, especially when the antenna assembly 310 is between the Earth and the Sun. Thus, the RF side 320 faces toward Earth, and the opposite solar side 380 faces away from Earth. In one embodiment, the antenna assembly 310 can angle more directly toward the Sun during certain times in the orbit. The solar energy can be utilized to power the electronic components of the array, assembly 310, or for array thrust. For example, the solar cell 388 can be made from photovoltaic material or other material that converts solar energy to electrical energy to operate as a solar panel, and also operate as an antenna structure (or other structure of the satellite or satellite module 310) to transmit and receive signals in accordance with the present disclosure. The electrical energy is used to power the satellite or satellite modules 310 or stored for later use. Thus, the same structure can be used for solar energy and for operation as a satellite antenna.

Middle Layer 350

As shown in FIG. 2, the middle layer 350 is positioned between the RF layer 320 and the solar layer 380. The middle layer 350 provides strength and rigidity to the antenna assembly 310, and houses the electronic components that operate the antenna 332 at the RF layer 320. In particular, the RF layer 320 and the solar layer 380 are formed of metal plates for the respective bodies 322, 382 with a thickness that is minimized to be lightweight. Because those layers 320, 380 are kept thin, they may lack sufficient strength to maintain the structure of the antenna assembly 310 and prevent the antenna assembly 310 from bending or flexing. It is important, however, that the antenna assembly 310 be sufficiently rigid to permit proper operation of the antennas 332 and of the antenna assembly 310.

Accordingly, the middle layer 350 has a support structure 352 that provides some flexibility but is sufficiently rigid to prevent the antenna assembly 310 from bending or flexing to an extent that might otherwise render the antenna assembly 310 inoperable or deteriorate the operation of the antenna assembly 310. Thus, the support structure 352 is lightweight and rigid to provide structural support and stiffness to the antenna assembly 310. In addition, the support structure 352 is lightweight, which is important for space applications and to reduce the weight for transport into space. In one example embodiment, the support structure 352 can be any suitable material and structure, such as a honeycomb structure from Nomex.

The middle layer 350 also houses the component assembly 360 that operate the antennas 332. The component assembly 360 is situated in openings formed in the support structure 352. The component assembly 360 can include, for example, a processing device 362, battery 364, wires or cables 366, 368, and a Front-End Module (FEM) 370. For example, the honeycomb structure of the middle layer 350 can include a separate opening that each respectively receive an individual component of the component assembly 360. That is, the processor 362 can be received in a first opening and the battery 364 can be received in a second opening. Thus, the components of the component assembly 360 are housed inside the antenna assembly 310, between the outer RF layer 320 and the outer solar layer 380. One or more of the components can be situated closer to one of the outer layers 320, 380. For example, the FEM 370 can be positioned closer to the RF layer 320 to be adjacent each respective antenna 332, or can be positioned closer to the solar layer 380 to avoid interference with the antenna 332. And, the processor 362 can be positioned closer to the solar layer 380 to avoid heating the antenna 332, or can be positioned closer to the RF layer 320 to avoid heat from the solar layer 380.

The component assembly 360 can also include thermal or heat dissipation components or heat spreaders such as, for example, heat pipes 314 to distribute heat from one local spot to another to spread the heat along the aluminum reflector 320. The heat pipes can also distribute heat from the solar panel 380 throughout the antenna assembly 310, such as to each FEM 370. The heat pipes operate by thermal conduction, though any suitable heat dissipation device can be provided other than heat pipes and need not include pipes. The heat dissipation components operate thermally and need not be controlled by the processor 362, though other heat dissipation components can be provided and the processor 362 can control the amount of heat transferred by the heat dissipation components. The heat dissipation components distribute heat throughout the antenna assembly 310, but can also distribute heat from one antenna assembly 310 to an adjacent antenna assembly 310.

The processing device 362 can be, for example, a processor or computing device. The processing device 362 controls and manages operation of the antenna assembly 310. For example, the processor 362 can control the signals that are transmitted and/or received over the antennas 332. The processor 362 can also control operation of the batteries 364, such as for example to direct solar energy to the battery 364 and from the battery 364 to the various components, such as via the solar pipes. The battery 364 stores energy and is charged by the solar panel 380 to be used in the electronics. The wires 366 are hi-speed cables that connect one antenna assembly 310 to adjacent antenna assemblies 310. The hi-speed cables 366 interconnect antenna assemblies 310 for synchronization between the antenna assemblies and to share power between the antenna assemblies 310.

The wire 368 are RF cables that connect the FEM 370 to the processor 362 to provide electrical communication between the FEM 370 and the processor 362. The FEM 370 is the electronics behind the antenna 332, and can include for example a transmitter and/or receiver. The FEM 370 is positioned in alignment with the antennas 332 and connect with the antennas 332 through openings in the first layer 320. A separate FEM 370 can be provided for each respective antenna 332, whereby each FEM 370 is aligned with the respective antenna 332. Or, one FEM 370 can be provided for multiple antennas 332. The antenna 332 is at the outside of the antenna assembly 310 at the outer-facing surface 328 of the outer RF layer 320. And the FEM 370 is inside the antenna assembly 310 at the middle layer 350 between the outer RF layer 320 and the outer solar layer 380. An aluminum spacer can be provided to separate the PCB from the aluminum reflector 320, and is a thermal bridge to it as well.

In addition, when the antenna assembly 310 is formed as part of an array of a plurality of antenna assemblies 310, one or more connectors 376 (FIG. 1) are provided at one or more sides 324 of the antenna assembly 310. The connectors 376 can be connected to the support structure 352, or to one or both of the outer layers 320, 380, or other suitable structure of the antenna assembly 310, such as for example by one or more fasteners or adhesive. The connectors 372 can include hinges, tape springs, and the like, which rotatably connect the antenna assembly 310 to the neighboring antenna assembly 310. Thus, the antenna assembly can be folded onto a neighboring antenna assembly to which it is connected in a stowed configuration, or unfolded and planar with the neighboring antenna assembly in a deployed configuration.

Antenna Assembly 310

The antenna assembly 310 is a Low-Earth Orbit (LEO) structure. In the embodiments described above, the antenna assembly 310 has an antenna 332 with antenna elements. However, the antenna assembly 310 can be utilized for any suitable purpose and have any suitable electronic components, and need not have an antenna 332 or antenna elements. The antenna assembly 310 houses electronic components at the middle layer 350 so that they do not interfere with the antennas 332 at the outward-facing surface 328 of the RF layer 310. The solar layer 380 provides solar energy to operate the electronic components. In addition, thermal insulation can be provided that retains heat received by the solar panel, at the interior of the antenna assembly. Thus, the power and processing are distributed throughout the array, i.e., the solar energy is collected (by the solar cell) at each antenna assembly 310 and consumed (by the electronic components) locally (at that same antenna assembly 310), and the processing is provided at each antenna assembly 310 rather than at a centrally located processing device.

The RF layer 320, middle layer 350, and solar layer 380 all have a similar shape. Though the shape shown in the figures is square, other suitable shapes can be utilized such as rectangular or triangular. In combination, those layers 320, 350, 380 form a relatively thin flat rectangular or square structure with a first outward-facing surface 328 formed by the RF layer 320 and a second outward-facing surface 384 formed by the solar layer 380. The middle layer 350 is sandwiched between the RF layer 320 and the solar layer 380. The layers 320, 350, 380 can be connected together in any suitable manner, for example by a fastener, resin or adhesive material that connects all of the layers 320, 350, 380 or connects adjacent layers. The bodies 332, 382 are made as thin as possible that still allows the bodies 332, 382 to support the respective antenna and solar cell, so that they are lightweight. However, the thinness makes those bodies 332, 382 flexible. The middle layer 350 provides the needed rigidity to prevent unwanted bending and flexing of the antenna assembly 310, but the middle layer 350 is made of lightweight material. The RF layer 320, middle layer 350, and solar layer 380 all have planar outer surfaces that are parallel to each other.

It is noted that the antenna assembly 310 does not include a separate housing. Rather, the layers 320, 350, 380 are connected to each other, including that the electronic layer 320 is directly connected to the middle layer 350, and the middle layer 350 is directly connected to the solar layer 380. The antenna assembly 310 forms a single unitary integral member. However, the antenna assembly 310 can also be/part of or attached to a separate discrete structural device, such as a radome, housing or frame. The housing can at least partially surround or enclose the layers 320, 350, 380.

The antenna assemblies 310 (e.g., antennas 332 or antenna elements) communicate with processing devices on Earth, such as for example a user device (e.g., cell phone, tablet, computer) and/or a ground station. The present disclosure also includes the method of utilizing the antenna assemblies 310 to communicate (i.e., transmit and/or receive signals to and/or from) with processing devices on Earth. The present disclosure also includes the method of processing devices on Earth communicating (i.e., transmit and/or receive signals to and/or from) with the antenna assemblies 310. In addition, the antenna assemblies 310 can be used in Low Earth Orbit (LEO) or in other orbits or for other applications. Sill further, while the disclosure has been described as for an array of antenna assemblies, the system can be utilized for other applications, such as for example data centers, reflectors, and other structures, both implemented in space or terrestrially.

Thermal Operation

The antenna assembly 310 is subject to extreme heat when in sunlight and due to the generation of high power by the solar cells. The flat structure of the antenna assembly provides a large area to dissipate the heat. The heat is generated locally at the antenna assembly 310 and is dissipated locally at the antenna assembly 310. It is important to dissipate the heat to support power generation without the heat destroying the components of the antenna assembly.

The processor 362 directs power from the solar cells 388 to the batteries 364 when the solar cells are being charged by the Sun or radiant solar energy. However, during deployment and during transport in the stowed configuration, only a limited number of antenna assemblies are exposed at the sides of the array and consequently solar energy does not reach the solar cells at the interior of the antenna array. The batteries 364 are turned OFF, such as for example by the processor, to conserve power until the solar panels are exposed to the Sun in space. And no heat is generated or distributed throughout the antenna assembly or between antenna assemblies. The system reduces the heat loss of the antenna assembly 310 by reducing emissivity by using low emissivity materials.

There are three potential sources of heat: solar heat flux, solar Albedo, and Earth IR. They are not the same magnitude or even in the same optical wavelength. Solar heat flux is a different wavelength than the Earth IR. The antenna side is an optimized radiator, with high emissivity and low solar absorptivity. That means if the antenna side is facing deep space, −270 C, it will quickly drop in temperature but if the antenna side is facing Earth, at −30 C, the antenna assembly will reach a warmer steady state temperature.

During deployment, the antenna assembly 310 is monitored to prevent the temperature from falling below a desired minimum temperature. The solar heat flux is optimized. In addition, the solar albedo heat flux is controlled to avoid heating the nadir side of the antenna assembly.

Once the antenna array is in the full deployed configuration, the RF components, such as the antenna elements and front-end module FEM 370 are in operation. The FEM 370 includes the components that enable operation of the antenna elements, such as receiving and transmitting components. The processor 362 controls the FEM components to transmit and/or receive information over the antenna elements. The antenna elements are at the outside surface of the antenna assembly 310 so they have direct and unobstructed communication with Earth. However, the FEM is located inside the antenna assembly at the inside of the reflector plate 320 aligned with each antenna, and situated in the structural support layer, such as in the openings of the honeycomb structure.

For example, the heating pipes extend throughout the structural support layer 350 to each FEM 370 and/or the processor 362 at the inside of the antenna assembly 310. Thus, the system provides heat to the antenna elements 332 and FEMs 370, and reduces heat to the solar cells 388, so that the heat to the antenna elements 332 and FEMs 370 is as uniform as possible during operation in the deployed configuration during the entire orbit cycle. Large temperature swings can impact the long-term performance of those devices.

The batteries 364 are placed as close to the center of the support structure 350, which is a low conductivity structure that thermally isolate/insulate the batteries 364 from the space environment.

The solar panels 388 are isolated to reduce the heat loss during an eclipse and heat absorbed during Sun exposure. Specifically, the solar cells 388 are isolated from the support structure 350, the processor 362, and the battery 364, and even the reflector and heat spreader. That is done because the solar cells 388 have a high solar absorptivity. They need to collect sunlight to convert the thermal energy to electrical energy. So they get hot in the sunlight and have a high emissivity, which means that they will cool very quickly in the shadow. The electrical components, such as the batteries, processor, FEM, PCB, processor PCB, and antenna element, cannot withstand the same temperature limits as the solar cell, and generally are not designed to operate below about −40 C. Thus, the system keeps the heat and heat loss limited to the solar cells, and keep the temperature as uniform as possible to the temperature-sensitive electrical components. Those temperature-sensitive components are positioned on the Nadir side of the antenna assembly and heat is spread from the ASIC to keep the components warm.

It is further noted that each orbit is approximately 90 minutes. So every 90 minutes, the solar cells are going from about −70 C on the shadow side of the Earth, to 80 C on the sunlight side of the Earth. The electronic components are protected from that temperature fluctuation, since otherwise it would deteriorate their performance. Thus, the system protects not only against absolute temperatures, but also against rapid temperature changes at high and cold temperatures.

In one example of the disclosure, the PCB and the antenna element each have a solar absorptivity of 0.3 and an IR emissivity of 0.8, and the reflector has a solar absorptivity of 0.2 and an IR emissivity of 0.9. The solar cells have a solar absorptivity of 0.9 and an IR emissivity of 0.9. The transverse side of the antenna assembly has a solar absorptivity of 0.23 and IR emissivity of 0.24.

The processor, such as an Application Specific Integrated Chip (ASIC) is placed on the Nadir side of the antenna assembly with a heat pipe to dissipate the heat to Earth, such as for example to cool the electronic components (e.g., processor). On the Earth side of the antenna assembly, white paint can be utilized on one or more of the internal or exterior components, such as on the channels to dissipate the heat to Earth while limiting the amount of Albedo (i.e., sunlight that is reflected off the Earth and back into space) absorbed. The ASIC is placed at the center of the antenna assembly, but toward the nadir side (i.e., closer to the reflector 320 than to the solar cells 380. The ASIC 362 is directly connected to the heat pipes that are directly connected to the Aluminum reflector.

The antenna assembly is planar and flat, including that the first and second sides are planar. The flat geometry allows a relative uniform temperature and allows one side, i.e., the RF side, to be shaded from the sun and the zenith side to dissipate heat to the Earth side, RF layer 320. Thus, the RF side 320 is completely shadowed from sunlight, and heat is transferred from the solar cells at the zenith side to the components on the nadir side.

The flat geometry also provides the necessary area to radiate heat to the Earth side. Heat generated by the processor is also transferred to the temperature-sensitive components at the nadir side of the antenna assembly. The Earth is not a great radiator of heat compared to space, but the flat antenna assembly design maximizes the heat dissipation area. The flatness of the antenna assembly maximizes the area facing the Earth to shade that side from the heat fluctuations from the sun. The flat antenna assembly also reduces the heat loss to space on the sides of the antenna assembly. The sides 324 are almost always facing deep space, and has low emissivity so that it doesn't lose heat to space. This is especially important in the stowed configuration and during deployment.

All internal surfaces of the antenna assembly have a low emissivity optical property to reduce the heat transfer the antenna assembly. For example, the internal surfaces of the solar cells, battery, processor, reflector, heat spreader and the structural support, have low emissivity. That reduces the radiation heat transfer inside the antenna assembly. A thin coating can be applied during manufacturing, or an Aluminum tape can be applied during assembly.

The IR Emissivity is a surface property that can be between 0 and 1. The higher the IR emissivity, the greater the radiation heat transfer. The goal is to reduce the internal radiation from the solar panels. A low emissivity means a lower heat transfer, which is helpful for two reasons. First, the solar panels won't transfer as much heat into the antenna assembly. And second, the solar panels won't transfer heat from the antenna assembly to space during an Eclipse. That means the antenna assembly will have a relatively uniform temperature during the entire orbit. A relatively uniform temperature means the antenna assembly will last longer due to Thermal Cycling fatigue.

In one example embodiment, the antenna assembly has two modes of operation, (i) heat into the antenna assembly (the heating mode) when the antenna assembly is in sunlight and heated by the sunlight; and (ii) heat out of the antenna assembly (the cooling mode) when the antenna assembly is in shadow and rapidly cooling. During the heating mode of operation, the solar cell absorbs solar energy, the solar cells increase in temperature and want to radiate that energy from their surface. The solar cells have an internal view factor to the antenna assembly. But the ASIC is fully operating and is dissipating heat. The heat pipes are dissipating heat from the ASIC to cool the ASIC. The heat pipes now also must dissipate heat entering the antenna assembly from the solar panels. A lower IR Emissivity reduces the heat transfer from the solar panels. That allows the heat pipes to operate more efficiently.

In the cooling mode of operation, the antenna assembly 310 is entering the Eclipse and the solar cells are quickly cooling off. The solar cells are colder and now the heat from the ASIC, batteries, heat pipes are all reversed so that heat is directed from the ASIC and batteries to the solar cells. But we don't want the antenna assembly to have a large temperature fluctuation every orbit. The lower emissivity of the internal surfaces (e.g., the RF and solar panels 320, 380) reduces the heat out of the antenna assembly during an Eclipse when you want to try to stay warm until you enter sunlight again. Thus, the low conductivity structure of the antenna assembly, including the honeycomb, reduces the heat loss during an eclipse and the heat absorbed during sun exposure.

Each antenna assembly 310 dissipates the heat locally, so that heat is not transferred to the neighboring antenna assembly 310. That is important to save mass and complexity of the system design.

However, once the array 10 is deployed in space, the temperature drops. One reason is the antenna assembly 310 rejects heat to Earth. If you take that optimized radiator for Earth and face space, that radiator is much more efficient and will work overtime cooling the entire antenna assembly 310. The temperature in space is about −270 C, which is much colder than Earth.

Thermal maximized the solar heat flux during deployment. Having the Solar Panel facing out is important for two reasons. First, the solar panels can absorb Solar Energy and power the batteries and the antenna assembly 310 to stay warm during deployment. And second, the solar panels are designed to face space and will have a larger temperature range unlike the Earth facing RF side.

Power can be shared during deployment; some antenna assemblies 310 will have a longer view to space and drop in temperature more than other antenna assemblies 310. If the antenna assemblies 310 share power, then the warmer antenna assemblies 310 can save their power and send it to the colder antenna assemblies 310 to power their heaters.

Temperature sensors can optionally be provided on one or more of the temperature-sensitive components, including for example the digital PCB and ASIC 362, batteries 368, and antenna FEM 370. The processor 362 can then direct heat and cooling of the various components, as needed.

Heat is not shared between antenna assemblies 310. Rather, electrical energy is shared between antenna assemblies. The colder antenna assembly 310 can use the electrical energy to power internal heaters, heat pipes or components. For example, on deployment, the ASIC 362 can be turned ON to act as a heater to dissipate heat. It will be more mass efficient to utilize a component as a heat source instead of adding additional heaters.

When the sun is present, the solar energy will do two things. First, it powers the solar panels to power the batteries. Second, it warms the antenna assembly due to the solar heat flux. An antenna assembly in the sun will always be warmer than an antenna assembly not in the sun. Most of the time any antenna assembly in the sunlight will have excess energy.

When the sunlight is not present, there still could be Earth IR heating or Albedo, which would provide some heat input but not a lot and no power would be generated from the solar panels. The assembly now operates as a function of geometry, view factors, sun angle, and thermal mass and local shadows from the antenna assembly. If one antenna assembly 310 blocking the sunlight, than the antenna assembly behind it will not receive any sunlight. The processor 362 monitors its temperature and turns ON the ASIC 362 to generate heat based on the temperature of the antenna assembly. Some antenna assemblies will have more power available, then they are going to have to share their power with the shadowed antenna assembly to prevent their batteries from running out of power during deployment.

The antenna assemblies open with the RF side (i.e., the side with the antenna element) facing Earth. That is important to keep the antenna assemblies 310 relatively warm since the Earth is warmer than space.

It is noted that the disclosure is shown and described with respect to an antenna array that is formed of many individual antenna assemblies that are transported to space in a stowed configuration and then moved to a deployed configuration in space. However, the disclosure can be utilized for applications other than antennas and antenna arrays. And the disclosure can be utilized for structures that are transported substantially in a deployed configuration.

It is further noted that the description and claims use several geometric or relational terms, such as planar, parallel, circular, flush, and flat. In addition, the description and claims use several directional or positioning terms and the like, such as top, bottom, inward, outward, distal, and proximal. Those terms are merely for convenience to facilitate the description based on the embodiments shown in the figures, and are not intended to limit the disclosure. Thus, it should be recognized that the disclosure can be described in other ways without those geometric, relational, directional or positioning terms. In addition, the geometric or relational terms may not be exact. For instance, antenna assembly and the array of antenna assemblies may not be exactly planar with one another but still be considered to be substantially planar because of, for example, tolerable bending or flexing allowed for operation that still permits operation. And, other suitable geometries and relationships can be provided without departing from the spirit and scope of the disclosure.

It is further noted that the present disclosure can be utilized separately, and can also be utilized in combination with the systems and methods disclosed in U.S. application Ser. No. 16/875,703, titled Solar, Electric, RF Radiator for Self-Contained Structure for Space Application Array, filed May 15, 2020, and U.S. application Ser. No. 16/875,646, titled Low Earth Orbit Mechanical Deployable Structure, filed May 15, 2020, the entire contents of which are incorporated herein by reference. Thus, for example, the thermal management can be self-deployable as shown and described in the LEO Mechanical Deployable Structure application, and/or can have the structure shown and described in the Solar, Electric, RF radiator application.

The foregoing description and drawings should be considered as illustrative only of the principles of the disclosure, which may be configured in a variety of ways and is not intended to be limited by the embodiment herein described. Numerous applications of the disclosure will readily occur to those skilled in the art. Therefore, it is not desired to limit the disclosure to the specific examples disclosed or the exact construction and operation shown and described. Rather, all suitable modifications and equivalents may be resorted to, falling within the scope of the disclosure.

The invention claimed is:

1. An antenna assembly comprising:
   a solar layer having one or more solar cells generating solar power;
   an antenna layer connected to said solar layer and having electronic components utilizing the solar power generated by said solar layer; and
   one or more heat pipes dissipating heat locally at said antenna assembly.

2. The assembly of claim 1, wherein said solar layer and said antenna layer are flat square or rectangular tiles.

3. The assembly of claim 1, further comprising a plurality of antenna assemblies connected together to form an antenna assembly array, each of said plurality of antenna assemblies generating solar power and utilizing the solar power generated at that each of said plurality of antenna assemblies.

4. The assembly of claim 3, said one or more heat pipes dissipating heat over the entire area of said plurality of antenna assemblies.

5. An antenna assembly comprising:
   a flat antenna layer forming a first outer surface of said antenna assembly, said antenna layer having a flat antenna plate with one or more antennas at said first outer surface of said antenna assembly;
   a flat solar layer forming a second outer surface of said antenna assembly, said solar layer having a flat solar plate with one or more solar cells at said second outer surface of said antenna assembly;
   a middle layer sandwiched between said antenna layer and said solar layer;
   one or more electronic components at said middle layer; and
   one or more heat transfer devices to transfer heat to said one or more electronic components, wherein said one or more heat transfer devices comprise one or more heat pipes for transferring heat.

6. The antenna assembly of claim 5, further comprising a thermal insulator member at said middle layer retaining said one or more electronic components.

7. The assembly of claim 5, said one or more electronic components comprising one or more front end modules.

8. The assembly of claim 7, said one or more electronic components comprising the one or more antennas, each associated with one of same one or more front end modules.

9. The assembly of claim 5, wherein said one or more antennas each comprise one or more antenna elements.

10. The assembly of claim 5, said one or more electronic components further comprising a processing device for operating said one or more electronic components.

11. The assembly of claim 5, said antenna assembly having a nadir side and a zenith side, wherein said one or more electronic components are at the nadir side and said flat solar layer is at the zenith side.

12. The assembly of claim 5, wherein said one or more heat transfer devices transfer heat from one of said one or more electronic components to other ones of said one or more electronic components.

13. The assembly of claim 5, wherein said middle layer and said one or more electronic devices each have low thermal emissivity.

14. A method for communicating comprising transmitting and/or receiving signals to and/or from the assembly of claim 1.

15. A method for communicating comprising transmitting and/or receiving signals to and/or from the assembly of claim 5.

16. The assembly of claim 5, wherein said flat solar plate and said flat antenna plate are square or rectangular.

17. The assembly of claim 5, further comprising a plurality of antenna assemblies connected together to form an antenna assembly array, each of said plurality of antenna assemblies generating solar power and utilizing the solar power generated at that each of said plurality of antenna assemblies.

18. The assembly of claim 1, said electronic components comprising one or more antenna elements at an outer surface of said antenna layer.

19. The assembly of claim 1, wherein the electronic components comprise one or more antenna elements.

20. The assembly of claim 1, wherein said one or more heat pipes transfer heat from one of said electronic components to other ones of said electronic components.

21. The assembly of claim 1, wherein said one or more heat pipes transfer heat from one of said electronic components to other ones of said electronic components in a neighboring antenna assembly.

22. The assembly of claim 5, wherein said one or more heat pipes transfer heat from one of said electronic components to other ones of said electronic components in a neighboring antenna assembly.

\* \* \* \* \*